United States Patent
Rausch et al.

(10) Patent No.: US 9,911,940 B2
(45) Date of Patent: Mar. 6, 2018

(54) ORGANIC LIGHT-EMITTING DIODE

(71) Applicant: OSRAM OLED GmbH, Regensburg (DE)

(72) Inventors: Andreas Rausch, Regensburg (DE); Carola Diez, Regensburg (DE); Nina Riegel, Tegernheim (DE); Dominik Pentlehner, Regensburg (DE); Britta Goeoetz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/502,198

(22) PCT Filed: Jul. 31, 2015

(86) PCT No.: PCT/EP2015/067719
§ 371 (c)(1),
(2) Date: Feb. 6, 2017

(87) PCT Pub. No.: WO2016/020296
PCT Pub. Date: Feb. 11, 2016

(65) Prior Publication Data
US 2017/0229669 A1 Aug. 10, 2017

(30) Foreign Application Priority Data
Aug. 7, 2014 (DE) .................. 10 2014 111 286

(51) Int. Cl.
*H01L 25/04* (2014.01)
*H01L 51/52* (2006.01)
*H01L 51/50* (2006.01)

(52) U.S. Cl.
CPC .......... *H01L 51/504* (2013.01); *H01L 25/048* (2013.01); *H01L 51/5044* (2013.01);
(Continued)

(58) Field of Classification Search
CPC ... H01L 25/048; H01L 51/048; H01L 51/504; H01L 51/5044; H01L 51/5218; H01L 51/5221; H01L 51/5265; H01L 51/5271
See application file for complete search history.

(56) References Cited

U.S. PATENT DOCUMENTS 7,812,359 B2 10/2010 Lee
2004/0135502 A1* 7/2004 Kobayashi ............ H01L 27/322
313/506
(Continued)

FOREIGN PATENT DOCUMENTS

DE 102007009530 A1 8/2008
DE 102012109143 A1 3/2014
(Continued)

OTHER PUBLICATIONS

Tsujimura, T., "OLED Displays Fundamentals and Applications", John Wiley & Sons, Inc.; 2012, pp. 143-145.

*Primary Examiner* — Peniel M Gumedzoe
(74) *Attorney, Agent, or Firm* — McDermott Will & Emery LLP

(57) ABSTRACT

The invention relates to an organic light-emitting diode (1000) with an organic layer sequence (100). The organic layer sequence (100) comprises a first organic emitter layer (1) for generating electromagnetic radiation of a first wavelength range (10) and a second organic emitter layer (2) for generating electromagnetic radiation of a second wavelength range (20). A charge carrier generation layer sequence (33), CGL for short, is arranged between the first (1) and the second (2) emitter layer, and the first emitter layer (1) and the second emitter layer (2) are electrically connected in series via said CGL. The CGL (33) additionally has a converter material which converts the radiation of the first (10) and/or the second (20) wavelength range at least partially into radiation of a third wavelength range (30). In
(Continued)

Figure 1:
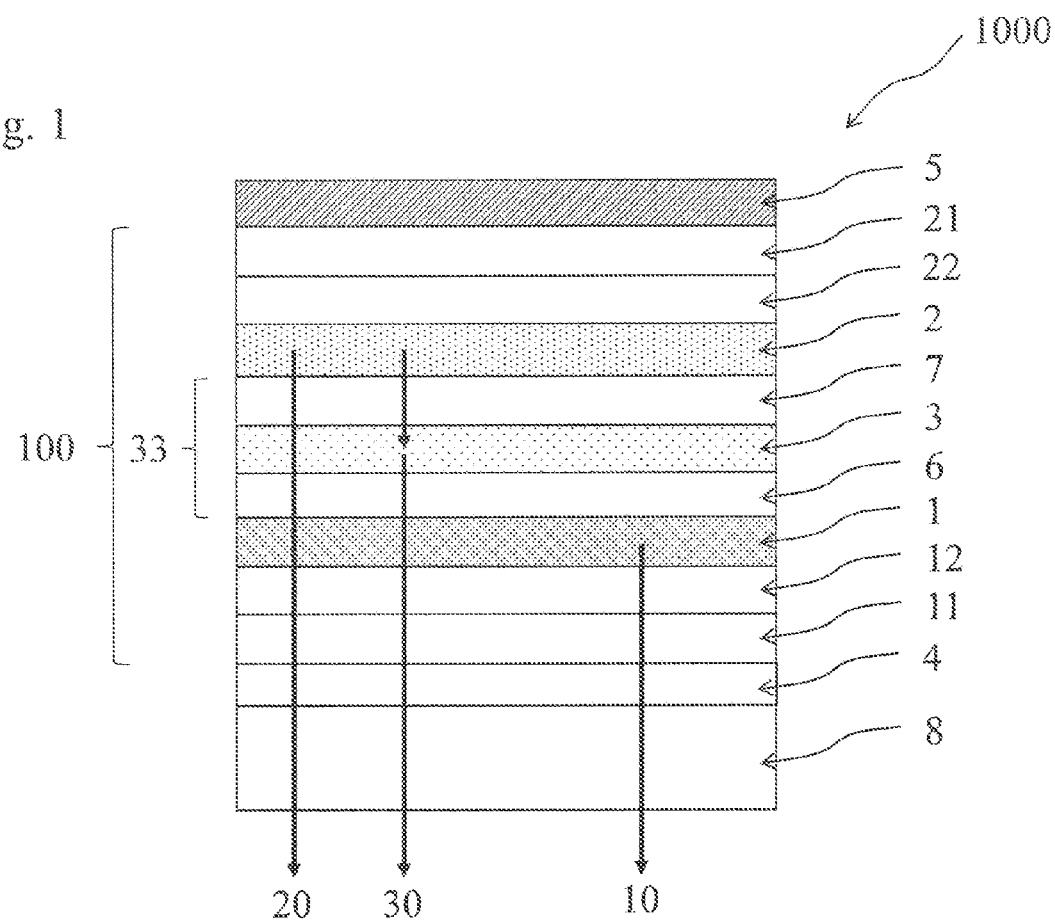

this manner, the organic light-emitting diode (1000) can emit mixed light with components of the first (10), second (20), and third (30) wavelength range.

16 Claims, 5 Drawing Sheets

(52) U.S. Cl.
CPC ...... *H01L 51/5218* (2013.01); *H01L 51/5221* (2013.01); *H01L 51/5265* (2013.01); *H01L 51/5271* (2013.01)

(56) References Cited

U.S. PATENT DOCUMENTS

2008/0315763 A1 12/2008 Dobbertin et al.
2009/0146560 A1 6/2009 Kim et al.

FOREIGN PATENT DOCUMENTS

EP         2330654 A1   6/2011
WO      2013104572 A1   7/2013

\* cited by examiner

ORGANIC LIGHT-EMITTING DIODE

An organic light-emitting diode is provided.

One object to be achieved is to provide an organic light-emitting diode, OLED for short, which is structured particularly simple and which particularly efficiently generates and couples-out light with different color portions.

This object is achieved by an OLED having the features of the independent claim. Advantageous configurations and developments are the subject-matter of the dependent claims.

According to at least one embodiment, the OLED comprises an organic layer sequence. The organic layer sequence comprises a first organic emitter layer for generating electromagnetic radiation of a first wavelength range. The organic layer sequence further comprises a second organic emitter layer for generating electromagnetic radiation of a second wavelength range.

The first and the second emitter layer can comprise or consist of an organic or organometallic light-emitting material. The light-emitting material is for example selected from phosphorescent and/or fluorescent substances. Furthermore, the first and the second emitter layer may comprise a matrix material, into which the light-emitting material is incorporated.

As phosphorescent substances, the following materials or combinations of materials are suitable, for example:
FIr6, FPt1 ([2-(4',6'-difluorophenyl)-pyridinato)-acetylacetonate]-platinum-II), FIrpic (bis(3,5-difluoro-2-(2-pyridyl)phenyl-(2-carboxypyridyl)-iridium-III), FIrN4, Irppy3 (fac-tris(2-phenyl-pyridyl)iridium complex), Ir(ppy)2acac, Ir(type)3 (tris[2-(4-totyl)-pyridinato]-iridium(III)), Ir(typ)2acac, Ir(bt)2acac, Ir(btp)2acac (bis [2-(2'-benzothienyl-pyridinato]-[acetyl-acetonato]iridium (III)), Ir(dbp)2acac (iridium(III)bis(dibenzo-[f,h] quinoxaline)-(acetylacetonate)), Ir(mdp)2acac (iridium (III)bis(2-methyldibenzo-[f,h]quinoxaline) (acetylacetonate)), Ir(pq)3, Ir(pq)2acac, Ir(piq)3, (CF3ppy)2Ir(pic), PtOEP (platiniumoctaethylporphyrine) or Os complexes such as 3 [Os(fppz)2(PPhMe2)2] and [Os(fptz)2(PPh2Me)2] or [Os(fppz)2(dppee).

As fluorescent substances, the following materials or combinations of materials are suitable, for example:
DCM (4-(dicyanomethylene)-2-methyl-6-(p-dimethyl-amino-styryl)4H-pyrane), DCM2 (4-(dicyanomethylene)-2-methyl-6-(julolidin-4-yl-vinyl)-4H-pyrane), rubrene (5,6,11,12-tetraphenyl-naphthacene), coumarin (C545T), TBSA (9,10-bis[(2'',7''''-di-t-butyl)-9',9''-spirobifluorenyl] anthracene), Zn complexes, Cu complexes.

For the first and/or the second emitter layer or as a matrix material for the first and/or second emitter layer, in which fluorescent and/or phosphorescent substances can be incorporated, the following materials or combinations of materials are suitable, for example: CBP (4,4'-bis(carbazol-9-yl)-2-2'dimethyl-biphenyl), TCTA (4,4',4''-tris(n-(naphth-2-yl)-N-phenyl-amino)triphenylamine), mCP, TCP (1,3,5-tris-carcazol-9-yl-bezene), CDBP (4,4'-bis(carbazol-9-yl)-2,2'-dimethyl-biphenyl), DPVBi (4,4-bis(2,2-diphenyl-ethen-1-yl)-diphenyl), spiro-PVBi (spiro-4,4'-bis(2,2-diphenyl-ethen-1-yl)-diphenyl), ADN (9,10-di(2-naphthyl) anthracene), perylene, carbazole derivatives, fluorene derivatives.

Preferably, in the OLED described herein, the first and the second emitter layer are arranged in a single organic layer sequence. In other words, no complete interruptions of the layer sequence are arranged between the first emitter layer and the second emitter layer, for example in the form of mainly inorganic electrodes. The first and the second emitter layer are therefore a part of a common, contiguous organic layer sequence.

According to at least one embodiment, the organic layer sequence comprises a charge carrier generation layer sequence, CGL for short, arranged between the first and the second emitter layer. The first and the second layer are electrically connected in series via the CGL, for example. The CGL is preferably an organic CGL.

According to at least one embodiment, the CGL comprises a converter material. The converter material partially or completely converts radiation of the first and/or of the second wavelength range into radiation of a third wavelength range, for example. For example, the organic light-emitting diode configured in this manner emits mixed light with portions of the first, second and/or third wavelength range. The mixed light can in particular be white light, preferably warm-white or cold-white light.

To that end, the first, the second and the third wavelength range are preferably configured to be different from one another, respectively. This does not necessarily mean that the first, the second and the third wavelength range are distinct from one another. Rather, the wave length ranges can in fact differ, but overlap in some partial areas.

In at least one embodiment, the OLED comprises an organic layer sequence with a first organic emitter layer for the generation of electromagnetic radiation of a first wave length range and a second organic emitter layer for the generation of electromagnetic radiation of a second wave length range. A CGL is arranged between the first and the second emitter layer, via which the first emitter layer and the second emitter layer are electrically connected in series. The CGL further comprises a converter material, converting radiation of the first and/or the second wavelength range at least partially into radiation of a third wavelength range. In this manner, the organic light-emitting diode can emit mixed light with portions of the first, second and third wavelength range.

Mixed light, in particular white light emitting OLEDs commonly require a complicated layer structure. In general, red, green and blue emitting materials are used, for example, which can be present within an OLED in individual layers or mixed together in a common layer. Often times, efficiency-decreasing and often hardly-controllable energy transfer processes occur between co-doped or directly adjacent emitter layers.

The idea underlying the invention described herein is in particular the one of replacing one of the emitter substances, in particular the red emitter substance, by a converter material. Here, the converter material is directly inserted between two emitter layers into the organic layer sequence within a CGL. By omitting an emitter substance, e.g. the red emitter substance, additional possibilities for uses and combinations of both remaining emitter substances, the green and the blue substances, for example, result. As a co-doping can be avoided between green and red emitter substances of the OLED described herein, for example, a matrix material can exclusively be optimized for the green emitter substance, or further matrix materials can be added.

A further advantage of the OLED described herein results from the fact that the converter material is arranged within the organic layer sequence and not, like usually, outside of the layer sequence, on transparent electrodes, for example. By this, all radiation modes generated within the layer sequence can be absorbed by the converter material and not only the modes which are actually decoupled from the layer sequence. Furthermore, the layer sequence can serve as a protective cover for the converter material, enabling the use of sensitive converter materials as well.

According to at least one embodiment, the GCL of the organic light-emitting diode comprises at least one n-conducting, i.e. electron-conducting organic layer and at least one p-conducting, i.e. hole-conducting organic layer. Together, the n-conducting organic layer and the p-conducting organic layer then form a diode, which is preferably reverse biased during operation. This way, a tunnel contact can be formed. By means of such a tunnel contact, n and p charge carriers can efficiently be generated and different emitter layers can electrically be connected in series by the tunnel contact, respectively.

According to at least one embodiment, the CGL comprises a conversion layer. The converter material is preferably partially or completely introduced into the conversion layer. The conversion layer can in particular be arranged between the n-conducting organic layer and the p-conducting organic layer. The conversion layer advantageously separates the n-conducting organic layer and the p-conducting organic layer from one another, so that no direct contact is established between the n-conducting and the p-conducting layer. The conversion layer is in direct contact with the p-conducting layer and/or the n-conducting layer, for example.

The conversion layer may therefore separate the often times reactive p-conducting and n-conducting organic layers from one another, ensuring a stable operation with low voltage losses of the OLED.

The n-conducting layer may comprise a material selected from a group comprising NET-18, 2,2' 2"-(1,3,5-benzinetriyl)-tris(1-phenyl-1-H-benzimidazole), 2-(4-biphenylyl)-5-(4-tert-butylphenyl)-1,3,4-oxadiazole, 2,9-dimethyl-4,7-diphenyl-1,10-phenantroline (BCP) 8-hydroxyquinolinolato-lithium, 4-naphtalene-1-yl)-3,5-diphenyl-4H-1,2,4-triazole, 1,3-bis[2-(2,2'-bipyridine-6-yl)-1, 3,4-oxadiazo-5-yl]benzene, 4,7-diphenyl-1,10-phenanthroline (BPhen), 3-(4-biphenylyl)-4-phenyl-5-tert-butylphenyl-1,2,4-triazole, bis(2-methyl-8-quinolinolate)-4-(phenylphenolato)aluminum, 6,6'-bis[5-biphenyl-4-yl)-1,3, 4-oxadiazo-2-yl]-2,2'-bipyridil, 2-phenyl-9,10-di(naphtalene-2-yl)-anthracene, 2,7-bis[2-(2,2'-bipyridine-6-yl)-1,3,4-oxadiazo-5-yl]-9,9-dimethylfluorene, 1,3-bis[2-(4-tert-butylphenyl)-1,3,4-oxadiazo-5-yl]benzene, 2-(naphtalene-2-yl)-4,7-diphenyl-1,10-phenantroline, 2,9-bis(naphatalene-2-yl)-4,7-diphenyl-1,10-phenantroline, tris (2,4,6-trimethyl-3-(pyridine-3-yl)phenyl)borane, 1-methyl-2-(4-(naphtalene-2-yl-phenyl)-1H-imidazo[4,5-f][1,10] phenanthroline, phenyl-dipyrenylphosphinoxide, naphthalenetetracarboxylicacid dianhydride and its imides, perylenetetracarboxylicacid dianhydride and its imides, materials based on siloles with a sylacyclopentadiene unit as well as mixtures of the above-mentioned substances.

Furthermore, the n-conducting layer may be doped. If the n-conducting layer is formed of a mixture of matrix and n-dopant, the matrix may comprise one of the materials of the n-conducting layer mentioned above. The matrix may comprise or be NET-18. The n-dopant of the n-conducting layer can be selected from a group comprising NDN-1, NDN-26, Na, Ca, MgAg, Cs, Li, Mg, $Cs_2CO_3$ and $Cs_3PO_4$.

The n-conducting layer may have a layer thickness ranging from approx. 1 nm to approx. 500 nm.

The p-conducting layer may comprise a material that is selected from a group comprising HAT-CN, F16CuPc, LG-101, α-NPD, NPB (N,N'-bis(naphthalene-1-yl)-N,N'-bis(phenyl)-benzidine), beta-NPB N,N'-bis(naphthalene-2-yl)-N,N'-bis(phenyl)-benzidine), TPD (N,N'-Bis(3-methyl-phenyl)-N,N'-bis(phenyl)-benzidine), Spiro TPD (N,N'-Bis (3-methylphenyl)-N,N'-bis(phenyl)-benzidine), Spiro-NPB (N,N'-Bis(naphthalene-1-yl)-N,N'-bis(phenyl)-spiro), DMFL-TPD N,N'-bis(3-methylphenyl)-N,N'-bis(phenyl)-9, 9-dimenthyl-fluorene), DMFL-NPB (N,N'-bis(naphthalene-1-yl)-N,N'-bis(phenyl)-9,9-dimethyl-fluorene), DPFL-TPD (N,N'-bis(3-methylphenyl)-N,N'-bis(phenyl)-9,9-diphenyl-fluorene), DPFL-NPB (N,N'-bis(naphthalene-1-yl)-N,N'-bis (phenyl)-9,9-diphenyl-fluorene), Spiro-TAD (2,2',7,7'-tetrakis(n,n-diphenylamino)-9,9'-spirobifluorene), 9,9-bis[4-(N, N-bis-biphenyl-4-yl-amino)phenyl]-9H-fluorene, 9,9-bis[4-(N,N-bis-naphthalene-2-yl-amino)phenyl]-9H-fluorene, 9,9-bis[4-(N,N"-bis-naphthalene-2-yl-N,N'-bis-phenyl-amino)-phenyl]-9H-fluorine, N,N'-bis(phenanthrene-9-yl)-N,N'-bis(phenyl)-benzidine, 2,7-bis[N,N-bis(9,9-spiro-bifluorene-2-yl)-amino]-9,9-spiro-bifluorene, 2,2'-bis[N,N-bis (biphenyl-4-yl)amino]9,9-spiro-bifluorene, 2,2'-bis(N,N-diphenyl-amino)9,9-spiro-bifluorene, di[4-(N,N-ditolyl-amino)-phenyl]cyclohexane, 2,2',7,7'-tetra(N, N-di-tolyl) amino-spiro-bifluorene, N,N,N',N'-tetra-naphthalene-2-yl-benzidine as well as mixtures of said compounds.

The p-conducting layer can also be doped. In the case, that the p-conducting layer is made of a substance mix of a matrix and a p-dopant, the dopant can be selected from a group comprising $MoO_x$, $WO_x$, $VO_x$, Cu(I)pFBz, Bi(III) pFBz, F4-TCNQ, NDP-2 and NDP-9. One or more of the above-mentioned materials can be used as a matrix material for the p-conducting layer, for example.

The p-conducting layer may have a layer thickness ranging from approximately 1 nm to approximately 500 nm.

According to at least one embodiment, the converter material in the conversion layer is embedded in a matrix material. The matrix material is, for example, one of the above-mentioned matrix materials, which can also be used for the light-emitting substances of the first and/or second emitter layer. In particular, the matrix material is selected in such a way that there is only a small voltage drop, for example, a negligibly small voltage drop, across the conversion layer. The matrix material preferably effects a good separation between the highly-reactive n- and p-conducting layers, so that these do not or only negligibly react with one another.

According to at least one embodiment, the concentration of the converter material in the conversion layer is at least 50/d %·nm, preferably at least 60/d %·nm, particularly preferably at least 65/d %·nm. As an alternative or in addition, the concentration of the converter material in the conversion layer is at most 90/d %·nm or at least 80/d %·nm or at least 70/d %·nm. Here, the thickness d indicates the thickness of the conversion layer in nanometers. The indications of the concentration preferably apply in particular to layer thicknesses of the conversion layer of at least one nm. Therefore, the concentrations indicated are concentrations that depend on layer thickness; the greater the layer thickness, the smaller becomes the concentration. Thereby, the proportion of the radiation converted by the conversion layer can be kept constant with varying layer thickness independent from the selected layer thickness of the conversion layer.

Here and in the following, the indicated percentages of concentrations can be the volume percentage or the mass percentage or the molar percentage of the converter material in the conversion layer.

As an alternative to the layer thickness-dependent concentration indications, the conversion layer can, however, have an absolute concentration percentage of the converter material of, for example, at least 50% or 60% or 65%. As an alternative or in addition, the absolute concentration of the converter material is at most 90% or 80% or 75%.

According to at least one embodiment, the conversion layer is completely formed of the converter material.

According to at least one embodiment, the GCL having the converter material contained therein is adapted to convert at least 10%, preferably at least 30%, particularly preferably at least 50% of the electromagnetic radiation impinging on it into radiation of the third wavelength range. This may apply to radiation of the first and/or second wavelength range impinging on the GCL.

According to at least one embodiment, the first emitter layer emits light in the blue spectral range during operation, preferably in a wavelength range between including 400 nm and 480 nm. The second emitter layer preferably emits light in the green spectral range, preferably in the wavelength range between including 480 nm and 560 nm. The converter material is then, for example, adapted to convert the blue light and/or the green light at least partially into red light, preferably into light in the wavelength range between including 560 nm and 790 nm or between including 630 nm and 790 nm. In total, the OLED indicated herein can then emit light with red, blue and green color portions, which preferably results in white mixed light to a viewer.

By replacing a red emitter layer with a red converter material, use of expensive iridium complexes, which are conventionally used for red emitter materials, can be dispensed with. The production costs of the OLED indicated herein can be reduced.

According to at least one embodiment, the CGL and/or the converter material contained therein of the indicated OLED per se is not electroluminescent. This means, in particular, other than the emitter materials in the emitter layers, that by only applying an intended electric voltage or electric power on the organic layer sequence the converter material does not emit radiation or no significantly perceptible radiation in the third wavelength range. The GCL or the converter material contained therein for emitting electromagnetic radiation in the third wavelength range rather requires an optical excitation with radiation, preferably with radiation of wavelengths smaller than the third wavelength range. That means, the GCL is photo-luminescent.

According to at least one embodiment, the converter material is an organic converter material. For example, the converter material comprises or consists of one of the following materials: fluoresceins, cumarines, rhodamines, stilbene derivatives, porphyrine derivatives, phthalocyanine derivatives.

According to at least one embodiment, molecules of the converter material have a preferred direction or a preferred plane during light emission. For example, the molecules of the converter material have their biggest expansion along a main direction. Upon conversion or optical excitation, the molecules of the converter material can form a dipole moment along the main direction and therefore preferably emit light perpendicular to the main direction. Such a preferred direction or preferred plane may occur in larger molecules of a converter material, for example. Here, preferred direction or preferred plane means that at least 80% or at least 90% of the light are emitted in a solid angle range of at most $4/5\pi$ or at most $4/10\pi$ or at most $4/20\pi$ around the preferred direction or in an angle range of at most 50° or 30° or 20° around the preferred plane.

According to at least one embodiment, the molecules of the converter materials are introduced into the organic layer sequence in a rectified manner. This means, for example, that the molecules of the converter material are introduced into the organic layer sequence in such a way that the preferred direction or the preferred plane of the light emission for each molecule points in the same direction or the same directions. The main directions of the molecules can for the most part be directed in parallel to one another, for example. By such a rectified direction of the molecules in the converter material, a preferred emission direction of the converter material can be set in a targeted manner. In particular, the preferred emission direction is selected as to be perpendicular to the main extension plane of the organic layer sequence.

According to at least one embodiment, the converter material has quantum dots. The quantum dots can, for example, comprise or be formed of one of the following materials: GaAs, GaP, GaN, sulfides such as ZnS or CdS or selenides, such as ZnSe or CdSe.

According to at least one embodiment, the conversion layer has a layer thickness of at least 1 nm or at least 5 nm or at least 10 nm. Alternatively or additionally, the layer thickness of the conversion layer is at most 20 nm or at most 18 nm or at most 15 nm.

As the materials preferably used as converter materials generally have intensive absorption bands, for example in the blue or green spectral range, the conversion effect occurs even with relatively thin layers. The proportion of converted light can be controlled in a targeted manner by layer thickness variation, enabling an adaption of the emission color and the color temperature, respectively.

According to at least one embodiment, particles of the converter material have a particle size of at least 1% or at least 10% or at least 30% of the layer thickness d of the conversion layer. Alternatively or in addition, the particle size is at most 90% or at most 80% or at most 60% of the layer thickness d of the conversion layer. Here, the term particle size refers to the particle diameter, such as the $D_{50}$ diameter of the particles in $Q_0$, for example.

In particular, the particle size of the converter material may be at least 1 nm or at least 5 nm or at least 10 nm. Alternatively, or in addition, the particle size is at most 30 nm or at most 20 nm or at most 15 nm.

According to at least one embodiment, the converter material for light conversion is configured as singlet emitter. This means in particular that radiation of the third wavelength range is generated by a transition from a singlet state into the assigned electrical basic state.

Therefore, in contrast to the electroluminescent excitation to triplet emitters, which are often expensive, can advantageously be dispensed with by using a converter material instead of an emitter material. Instead, singlet emitters having intensive absorption bands and high photoluminescence quantum efficiencies can be used.

According to at least one embodiment, the organic light-emitting diode is a bi-directionally differently-emitting light-emitting diode. That means that the light-emitting diode emits radiation in both directions perpendicular to a main extension plane of the organic layer sequence or the CGL. The light-emitting diode is a light-emitting diode emitting on two sides, commonly referred to as top-bottom emitter.

According to at least one embodiment, the OLED emits warm-white light with a color temperature of at most 3,500 K or at most 3,200 K or at most 2,800 K in one direction. In the other direction, i.e. in the opposite direction, the OLED emits for example cold-white light with a color temperature of at least 4,000 K or at least 4,300 K or at least 4,600 K.

Such a bi-directionally emitting OLED with two different color temperatures can be achieved, for example, in that the first emitter layer is a green-emitting layer, the second emitter layer is a blue-emitting layer and the converter material emits red light. For an observer, when looking at the blue emitter layer, the emitted light then appears to be colder than the light when looking at the green emitter layer.

According to at least one embodiment of the OLED, one or multiple organic layers in the layer sequence have scattering particles for efficient out-coupling of light. The scattering particles can at least comprise or consist of one of the following materials: titanium oxide, aluminum oxide, yttrium oxide, silicon oxide. The size of the scattering particles is for example at most 1 µm or at most 600 µm or at most 400 µm. As an alternative or in addition, the size of the scattering particles is at least 50 nm or at least 100 nm or at least 200 nm. However, layers bordering the organic layer sequence may as well comprise such scattering particles.

Light of the first and/or second and/or third wavelength range can be scattered on the scattering particles introduced in the organic layers, reducing the portion of the light totally reflected on boundary surfaces of the OLED. By means of the scattering particles, therefore the light out-coupling efficiency and thus the total efficiency of the OLED provided herein can be improved.

According to at least one embodiment, the OLED comprises two electrodes, in particular one anode and one cathode. The organic layer sequence is arranged, for example, between the anode and the cathode then. The anode and the cathode therefore serve for the injection of current into the organic layer sequence. Preferably, the OLED is operated with the direct current, here.

According to at least one embodiment, the anode and/or the cathode can be transparent for the light produced by the organic layer sequence. In this case, transparent means that the anode and/or the cathode are transparent and/or not absorbent and/or not reflective for the light generated by the organic layer sequence, for example. The light generated in the layer sequence can be coupled out of the OLED via the anode and/or the cathode.

The transparent electrodes comprise or consist of a transparent conductive oxide, for example. Transparent conductive oxides, TCO for short, are usually metal oxides such as for example zinc oxide, tin oxide, cadmium oxide, titanium oxide, indium oxide and indium tin oxide (ITO). Furthermore, aluminum zinc oxides (ACO) or indium zinc oxide (IZO) may be considered.

According to at least one embodiment, an organic charge injection layer and/or organic charge transport layer is arranged between the first emitter layer and the electrode closest to the first emitter layer. As an alternative or in addition, an organic charge injection layer and/or organic charge transport layer can also be arranged between the second emitter layer and the electrode closest to the second emitter layer. Preferably, the charge injection layer and/or charge transport layer closest to the anode are designed as a hole injection layer and/or hole transport layer. Preferably, the charge injection layer and/or charge transport layer closest to the cathode are designed as an electron injection layer and/or electron transport layer. Also, further charge transport layers can be arranged between the first and the second emitter layer, for example between the GCL and the first and/or second emitter layer.

The charge injection and charge transport layers serve for efficient out-coupling of charge carriers from the anode or the cathode into the organic layer sequence and a subsequent efficient charge transport. The charge injection layers are preferably in direct contact with the electrodes.

Examples for materials with hole transporting and/or hole injecting properties are: 1-TNATA (4,4',4"-tris(N-(naphtha-1-yl)-N-phenyl-amino)triphenylamine, 2-TNATA (4,4',4"-tris(N-(naphtha-2-yl)-N-phenyl-amino)triphenylamine, MTDATA (4,4',4"-tris(N-3-methylphenyl-N-phenyl-amino)-triphenylamine), aNPD (N,N'-bis(naphthalene-1-yl)-N,N'-bis(phenyl)benzidine), bNPD (N,N'-bis(naphthalene-2-yl)-N,N'-bis(phenyl)benzidine) TPD (N,N'-bis(3-methylphenyl)-N,N'-bis(phenyl)benzidine), spTAD (2,2',7,7'-diphenylamino-spiro-9,9'-bifluorene), Cu—PC (phthalocyanine-copper-complex) or other PC-metal-complexes, TAPC (1,1-bis-[(4-phenyl-)-bis-(4',4"-methyl-phenyl)-amino]-cyclohexane) and combinations thereof.

Examples for materials with electron-transporting and/or electron-injecting properties are: Alq3 (tris(8-hydroxyquinoline)aluminum, BAlq2 (bis-[2-methyl-8-quinolato]-[4-phenylphenolato]-aluminum (III)), BPhen (4,7-diphenyl-1,10-phenanthroline), BCP (2,9-dimethyl-4,7-diphenyl-1,10-phenanthroline), TPBi (1,3,5-tris-(1-phenyl-1H-benzimidazol-2-yl)-benzene), TAZ (3-(4-biphenyl)-4-phenyl-5-(4-tert-butylphenyl)-1,2,4-triazol), TAZ2 (3,5-diphenyl-4-naphth-1-yl-1,2,4-triazol), t-Bu-PBD (2-(-biphenyl)-5-(4-tert-butyl-phenyl)-1,3,4-oxadiazol), triazine, triazine derivatives and combinations thereof.

According to at least one embodiment, one of the two electrodes is configured to be transparent, the other electrode is largely or completely formed from a metal, that is reflective or mirroring for the radiation emitted by the organic layer sequence. For example, the metallic electrode is formed of silver, gold, aluminum, titanium, magnesium, barium, indium, calcium, samarium, lithium or platinum or an alloy of said materials. Such an OLED having a metallic electrode mainly emits radiation in one direction only, namely in the direction away from the non-transparent electrode through the transparent electrode.

According to at least one embodiment, the OLED has a transparent substrate, onto which the organic layer sequence is attached. Such a transparent substrate can, for example, mechanically stabilize the organic layer sequence and make the OLED self-supporting. The transparent substrate can, for example, comprise or consist of a clear or frosted material such as glass. Preferably, radiation generated in the organic layer sequence can be coupled-out of the OLED via the transparent substrate. To that end, preferably, the electrode arranged between the transparent substrate and the organic layer sequence is transparent, too.

According to at least one embodiment, at least one of the transparent electrodes of the OLED has out-coupling elements in the form of scattering particles and/or surface structures. The scattering particles can be the above mentioned scattering particles, which can also be introduced into the organic layers of the organic layer sequence. The surface structures can be roughenings on the electrodes, for example. These surface structures can then be arranged on the side of the transparent electrode facing or facing away from the organic layer sequence. Preferably, the surface structures respectively the scattering particles of the transparent electrode have a size which is at least an eighth or a quarter or half of the wavelength emitted by the organic layer sequence. This way, the scattering of the light produced by the organic layer can occur on the out-coupling elements of the transparent electrode, which in turn reduces losses of the OLED due to total reflection.

An organic light-emitting diode described herein is explained in more detail with reference to the drawings by means of exemplary embodiments. Like reference numerals indicate like elements throughout the individual figures. However, the illustrated relations are not made to scale, rather individual elements can be illustrated in an exaggerated manner.

The figures show in:

FIGS. 1 to 5 schematic sectional illustrations of exemplary embodiments of organic light-emitting diodes described herein.

FIG. 1 shows an organic light-emitting diode 1000, OLED for short, with a substrate 8 and an anode 4 attached onto the substrate 8. The substrate 8 is, for example, a transparent, clear-view substrate, such as glass, the anode 4 is, for example, made of a transparent conductive oxide, such as ITO.

An organic layer sequence 100 is attached onto the side of the anode 4 facing away from the substrate 8. On the side of the organic layer sequence 100 facing away from the anode 4 is, in turn, arranged, a cathode 5, which presently is formed of a metal such as aluminum or silver. The cathode 5 is designed to be reflective or mirroring, so that an electromagnetic radiation generated in the organic layer sequence 100 is reflected on the cathode 5 and directed towards the anode 4 and can be coupled-out of the OLED 1000 via the anode 4 and the transparent substrate 8. Therefore, the exemplary embodiment of FIG. 1 is a bottom emitter.

The organic layer sequence 100 of FIG. 1 has a multitude of organic layers. In FIG. 1, a hole injection layer 11, HIL for short, and a hole transport layer 12, HTL for short, are attached onto the anode 4. The HIL 11 is preferably in direct contact with the anode 4. Holes from the anode 4 can efficiently be injected into the organic layer sequence 100 by means of the HTL 12 and subsequently be transported further by means of the HTL 12 in an efficient way.

In FIG. 1, a first emitter layer 1 is attached onto the side of the HTL 12 facing away from the anode 4. The first emitter layer 1 comprises a fluorescent or phosphorescent emitter material, for example, which is embedded into a matrix material. The emitter material in the first emitter layer 1 is selected such that the first emitter layer 1 generates radiation in a first wavelength range 10 during operation. In the present case, it is blue light, for example.

A charge carrier generation layer sequence 33, CGL for short, is attached onto a side of the first emitter layer 1 facing away from the anode 4. A second emitter layer 2 is, in turn, attached onto a side of the CGL 33 facing away from the first emitter layer 1, so that the CGL 33 is located between the first 1 and second 2 emitter layer.

The second emitter layer 2 can in turn comprise fluorescent or phosphorescent emitter material in a matrix material. During operation, the second emitter layer 2 emits radiation in a second wavelength range 20, in the green wavelength range, for example.

In FIG. 1, on a side of the second emitter layer 2 facing away from the CGL 33, an electron transport layer 22, ETL for short, and an electron injection layer 21, EIL, for short is arranged. The EIL 21, in turn, serves to efficiently inject electrons from the cathode 5 into the organic layer sequence 100, and the ETL 22 transports the electrons to the second emitter layer 2. The EIL 21 is preferably in direct contact with the cathode 5.

In FIG. 1, the CGL 33 serves to connect the first emitter layer 1 and the second emitter layer 2 in series, and therefore, additional electrodes between the first emitter layer 1 and the second emitter layer 2 are dispensed with in FIG. 1. In the CGL 33, electrons for operation of the first emitter layer 1 as well as holes for operation of the second emitter layer 2 are generated during operation of the OLED 1000. To that end, the CGL 33 is designed as a pn-junction operated in the reverse direction and acting as a tunnel contact in the present example. The CGL 33 therefore comprises an organic, n-conductive layer 6 facing the anode 4, which effectively serves as an electron generating layer, n-GCL for short. The CGL 33 further comprises a p-conductive organic layer 7 facing the cathode 5, serving as a hole generation layer, p-CGL, for short.

Between the n-conductive organic layer 6 and the p-conductive organic layer 7 is also arranged a conversion layer 3 in FIG. 1, separating the n-conducting organic layer 6 and the p-conducting organic layer 7 from one another. The conversion layer 3 contains a converter material, which can at least partially convert the radiation generated by the first emitter layer 1 of the first wavelength range 10 and/or the radiation emitted by the second emitter layer 2 of the second wavelength range 20 into radiation of a third wavelength range 30. Here, a red converter material is selected for the conversion layer 3, so that the blue light emitted by the first emitter layer 1 and the green light emitted by the second emitter layer 2 can at least partially be converted into red light. This way, light having red, green and blue color portions can be emitted via the transparent anode 4 and the transparent substrate 8.

Due to the fact that in FIG. 1, the second green-emitting emitter layer 2 is arranged between the conversion layer 3 and the mirroring cathode 5, the green light emitted by the second emitter layer 2 has to pass the conversion layer 3 before it can be coupled-out of the OLED 1000. In contrast, the first, blue-emitting emitter layer 1 is arranged between the transparent anode 4 and the conversion layer 3 so that only the part emitted by the first emitter layer 1 towards the cathode 5 has to pass through the conversion layer 3. Overall, a comparatively small portion of green light is converted into red light in the exemplary embodiment of FIG. 1, wherein only a comparatively small amount of the blue light is converted into red light. The light emitted by the OLED 1000 of FIG. 1 thus comprises a large blue component and can be perceived by an observer as cold-white light having a color temperature of at least 4,000 K, for example.

Figure 2:
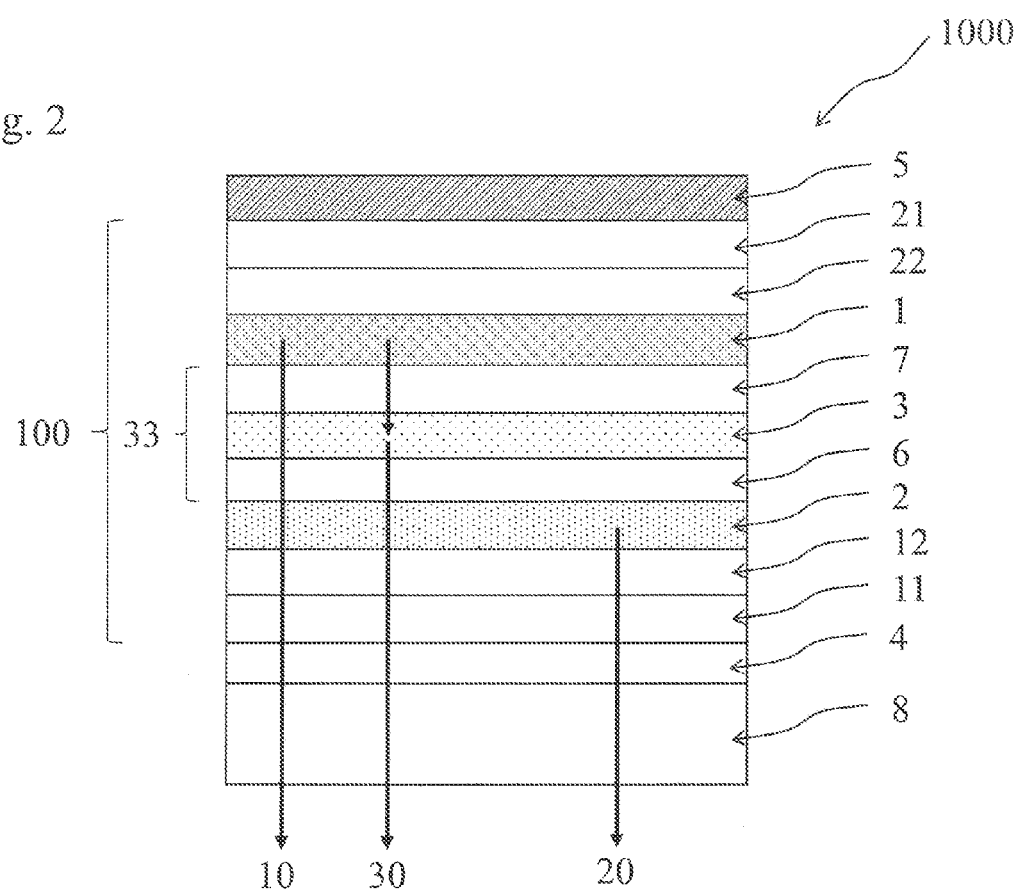

In contrast to the exemplary embodiment of FIG. 1, merely the first 1 and the second 2 emitter layer are switched with one another in the exemplary embodiment of FIG. 2. The first emitter layer 1 emitting blue light of the first wavelength range 20 is thus arranged between the conversion layer 3 and the reflecting cathode 5 in FIG. 2. The second emitter layer 2 emitting the green light of the second wavelength range 20 is arranged between the conversion layer 3 and the transparent anode 4. In contrast to FIG. 1, only part of the green light has to pass through the conversion layer 3 prior to light decoupling during operation in the example of FIG. 2, whereas the entire blue light emitted by the first emitter layer 1 has to pass the conversion layer 3. Therefore, also a comparatively small amount of green light is converted into red light in FIG. 2, whereas a large amount of the blue light is converted into red light. The light emitted by the OLED 1000 of FIG. 2 thus has a large green portion and a smaller blue portion and therefore it appears as warm-white light with a color temperature of at most 3,000 K, for example, for an observer.

Figure 3:
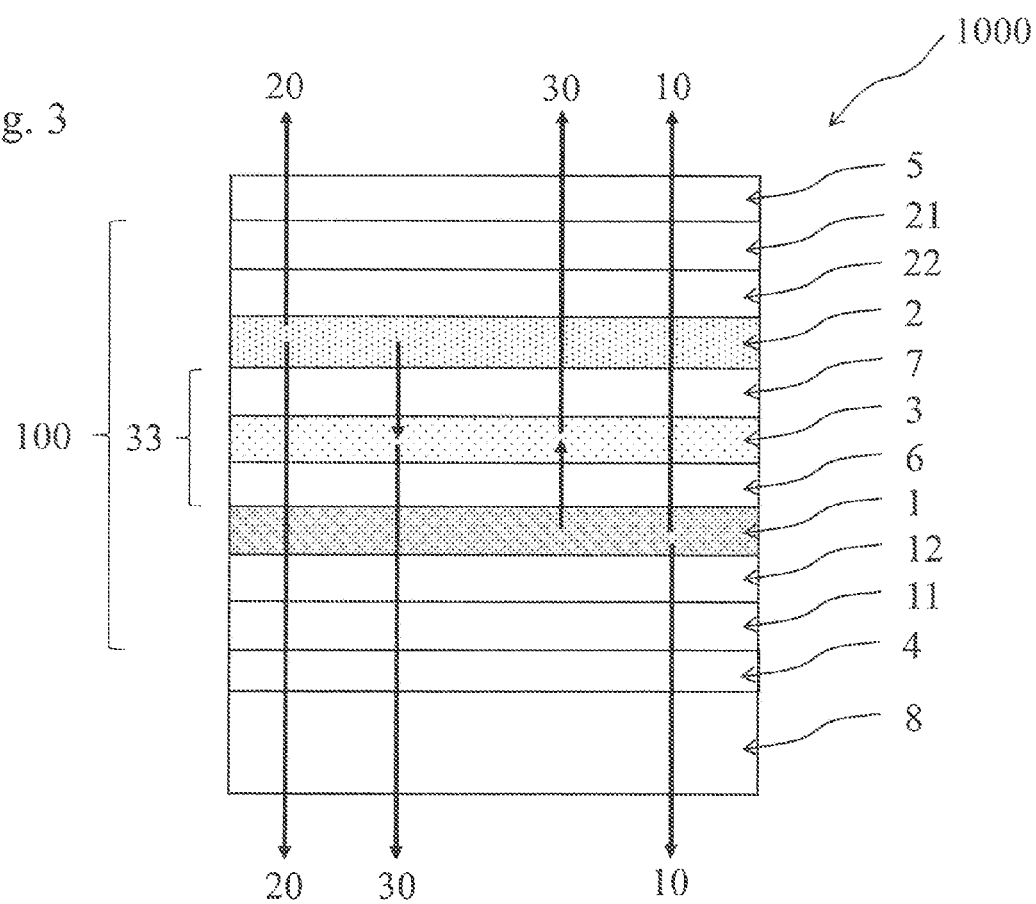

In the exemplary embodiment of FIG. 3, the reflecting cathode 5 is replaced by a transparent cathode 5. To that end, the transparent cathode 5 can be formed of a transparent conductive oxide, for example. Due to the fact that in FIG. 3, both electrodes are designed transparent, the OLED 1000 of FIG. 3 can emit light in both directions perpendicular to the main extension direction of the conversion layer 3. The OLED 1000 of FIG. 3 is thus a bi-directionally-emitting OLED 1000. The arrangement of the organic layers within the organic layer sequence 100 is the same in FIG. 3 as it is in FIG. 1. Light coupled-out of the OLED 1000 via the cathode 5 appears for example to be a warm-white light for an observer, as part of the blue light emitted by the first emitter layer 1 is partially converted into red light on the way to the cathode 5. On the other hand, light coupled-out of the OLED 1000 via the anode 4 and the transparent substrate 8 appears to be a cold-white light, for example, for an observer, as the blue light emitted by the first emitter layer 1 does not need to pass the red-converting conversion layer 3 on the way to the anode 4.

Figure 4:
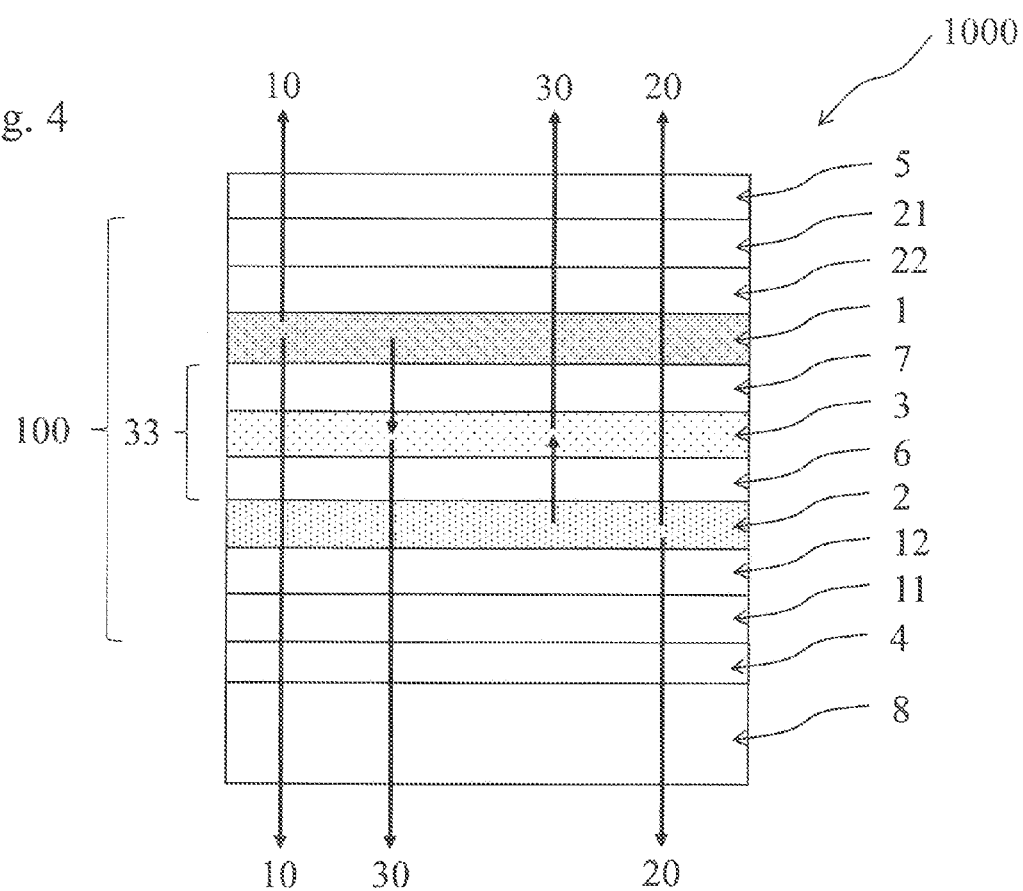

FIG. 4 as well shows a bi-directionally-emitting OLED 1000 having a structure similar to the OLED 1000 of FIG. 3. In FIG. 4, the layer structure of the organic layer sequence 100 is selected to be exactly the same as in FIG. 2, that means, the first emitter layer 1 is arranged between cathode 5 and conversion layer 3, whereas the second emitter layer 2 is arranged between the conversion layer 3 and anode 4. In FIG. 4, due to this inverse arrangement of the first 1 and second 2 emitter layer, the light emitted via the cathode 5 can for example be perceived as cold-white light, whereas the light emitted via the anode 4 is perceived as warm-white light, for example.

Figure 5:
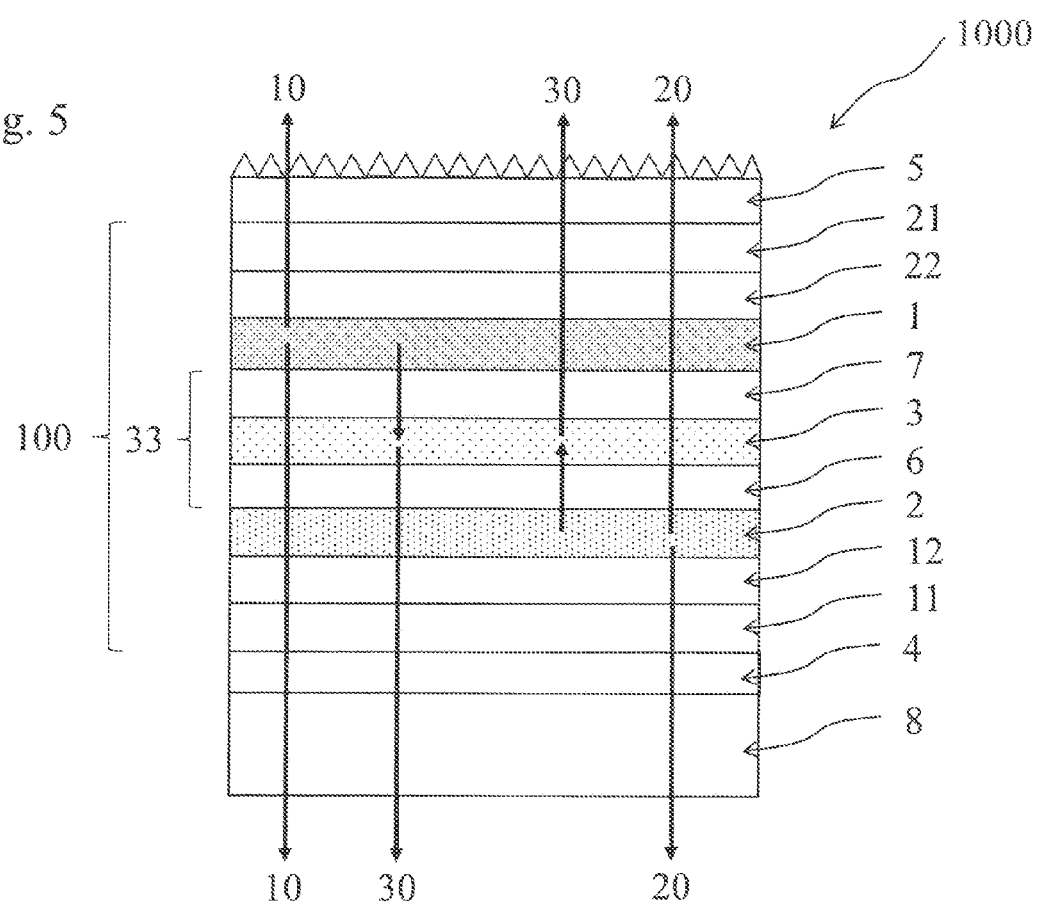

The exemplary embodiment of FIG. 5 shows the same layer structure of the OLED 1000 as the exemplary embodiment of FIG. 4. In addition, however, an out-coupling element is attached onto the side of the organic layer sequence 100 facing away from the cathode 5. In the present example, the out-coupling element is configured as a roughening of the surface of the cathode 5. Light can be scattered on this roughening, whereby total reflection within the OLED is reduced and the light out-coupling efficiency is increased via the cathode 5.

Such out-coupling elements can also be attached onto the anode 4 or onto the transparent substrate 8, respectively.

Furthermore, in contrast to the illustration in FIGS. 1 to 5, one or multiple of the organic layers or the electrodes 4, 5 have scattering particles, present in the form of titanium oxide particles measuring several hundred nanometers. Radiation generated by the organic layer sequence 100 can be efficiently scattered also on such scattering particles, increasing a light out-coupling efficiency of the OLED 1000.

The invention described herein is not limited by the description by means of the exemplary embodiments. The invention rather comprises every new feature as well as any combination of features, in particular any combination of features in the patent claims, even if said feature or said combination per se is not explicitly indicated in the patent claims or exemplary embodiments.

This patent application claims the priority of German patent application 10 2014 111 286.5, the disclosure of which is incorporated herein by reference.

LIST OF REFERENCE NUMERALS 1 first emitter layer
2 second emitter layer
3 conversion layer
4 anode
5 cathode
6 n-conducting organic layer
7 p-conducting organic layer
8 substrate
10 radiation of the first wavelength
20 radiation of the second wavelength
30 radiation of the third wavelength
33 charge carrier generation layer sequence, CGL for short
100 organic layer sequence
1000 organic light-emitting diode

The invention claimed is:

1. An organic light-emitting diode comprising an organic layer sequence, with: a first organic emitter layer for generating electromagnetic radiation of a first wavelength range, a second organic emitter layer for generating electromagnetic radiation of a second wavelength range, a charge carrier generation layer sequence arranged between the first and the second organic emitter layers, via which the first emitter layer and the second emitter layer are electrically connected in series, wherein
the charge carrier generation layer sequence comprises a converter material, which converts radiation of the first and/or the second wavelength range at least partially into radiation of a third wavelength range, so that the organic light-emitting diode emits mixed light with portions of the first, second and the third wavelength range.

2. The organic light-emitting diode according to claim 1, wherein the charge carrier generation layer sequence comprises at least one n-conducting organic layer, at least one p-conducting organic layer and a conversion layer, wherein the converter material is introduced into the conversion layer,
wherein the conversion layer is arranged between the n-conducting layer and the p-conducting layer and separates the n-conducting layer and the p-conducting layer from one another.

3. The organic light-emitting diode according to claim 1, wherein
the converter material in the conversion layer is embedded in a matrix material and
the concentration of the converter material in the conversion layer for thicknesses of the conversion layer of at least 1 nm ranges from between including 50/d %·nm and 90/d %·nm , d being the thickness of the conversion layer in the unit of nanometers.

4. The organic light-emitting diode according to claim 2, wherein the conversion layer is completely formed from the converter material.

5. The organic light-emitting diode according to claim 1, wherein the charge carrier generation layer sequence is adapted to convert at least 10% of the electromagnetic radiation of the first and/or second wavelength range impinging on it into radiation of the third wavelength range.

6. The organic light-emitting diode according to claim 1, wherein the first organic emitter layer emits light in the blue spectral range, the second organic emitter layer emits light in the green spectral range and the converter material converts the blue light and/or the green light at least partially into red light during operation.

7. The organic light-emitting diode according to claim 1, wherein the charge carrier generation layer sequence per se and the converter material contained therein are not electroluminescent.

8. The organic light-emitting diode according to claim 1, wherein the converter material is formed of or comprises one of the following materials:
fluoresceins, cumarines, rhodamines, stilbene derivatives, porphyrine derivatives, phthalocyanine derivatives.

9. The organic light-emitting diode according to claim 1, wherein molecules of the converter material have a preferred direction or preferred plane during light emission, and wherein the molecules of the converter material are introduced into the organic layer sequence in a rectified manner, so that a preferred emission direction of the converter material is set in a targeted manner.

10. The organic light-emitting diode according to claim 1, wherein the converter material comprises quantum dots comprising GaAs and/or GaP and/or GaN and/or sulfides and/or selenides.

11. The organic light-emitting diode according to claim 2, wherein the conversion layer has a layer thickness d between including 1 nm and 20 nm.

12. The organic light-emitting diode according to claim 1, wherein the converter material for the conversion of light is a singlet emitter, which generates radiation of the third wavelength range by a transition from a singlet state into an assigned electric basic state.

13. The organic light-emitting diode according to claim 1, wherein the organic light-emitting diode is a bi-directionally differently-emitting light-emitting diode, which emits radiation in both directions perpendicular to a main extension plane of the charge carrier generation layer sequence, wherein in the one direction, warm-white light with a color temperature of at most 3,500 K is emitted and wherein in the other, opposite direction, cold-white light with a color temperature of at least 4,000 K is emitted.

14. The organic light-emitting diode according to claim 1, wherein one or more organic layers in the layer sequence or layers bordering the layer sequence comprise scattering particles, which comprise at least one of the following materials or are formed thereof: titanium oxide, aluminum oxide, yttrium oxide, silicon oxide.

15. The organic light-emitting diode according to claim 1, wherein at least one transparent electrode bordering the organic layer sequence comprises scattering particles and/or surface structures for improved light out-coupling.

16. The organic light-emitting diode according to claim 1, wherein no complete interruptions of the organic layer sequence are arranged between the first organic emitter layer and the second emitter layer.

* * * * *